(12) United States Patent
Friel et al.

(10) Patent No.: US 9,301,075 B2
(45) Date of Patent: Mar. 29, 2016

(54) MEMS MICROPHONE WITH OUT-GASSING OPENINGS AND METHOD OF MANUFACTURING THE SAME

(71) Applicant: Knowles Electronics, LLC, Itasca, IL (US)

(72) Inventors: Kurt B. Friel, Sycamore, IL (US); John B. Szczech, Schaumburg, IL (US)

(73) Assignee: Knowles Electronics, LLC, Itasca, IL (US)

(*) Notice: Subject to any disclaimer, the term of this patent is extended or adjusted under 35 U.S.C. 154(b) by 0 days.

(21) Appl. No.: 14/252,037

(22) Filed: Apr. 14, 2014

(65) Prior Publication Data

US 2014/0321687 A1    Oct. 30, 2014

Related U.S. Application Data

(60) Provisional application No. 61/815,419, filed on Apr. 24, 2013.

(51) Int. Cl.
*H04R 25/00* (2006.01)
*H04R 31/00* (2006.01)
(Continued)

(52) U.S. Cl.
CPC .............. *H04R 31/00* (2013.01); *H04R 19/005* (2013.01); *H04R 19/04* (2013.01); *Y10T 29/49005* (2013.01)

(58) Field of Classification Search
CPC ...... H04R 19/00; H04R 19/04; H04R 19/016; H04R 19/005; H04R 1/04; H04R 1/083; H04R 1/086; H04R 23/006; H04R 25/00; H04R 2201/0257
USPC .......................................... 381/369, 174, 175
See application file for complete search history.

(56) References Cited

U.S. PATENT DOCUMENTS 5,740,261 A    4/1998    Loeppert
6,535,460 B2    3/2003    Loeppert
(Continued)

FOREIGN PATENT DOCUMENTS

JP    2009247007 A    10/2009

OTHER PUBLICATIONS

International Search Report and Written Opinion for PCT/US2014/034211 dated Aug. 14, 2014 (10 pages).

*Primary Examiner* — Brian Ensey
(74) *Attorney, Agent, or Firm* — Foley & Lardner LLP

(57) ABSTRACT

An acoustic apparatus includes a substrate, micro electro mechanical system (MEMS) die, and an integrated circuit. The substrate includes a permanent opening that extends there through. The micro electro mechanical system (MEMS) die is disposed over the permanent opening and the MEMS die includes a pierce-less diaphragm that is moved by sound energy. A first temporary opening extends through the substrate. The integrated circuit is disposed on the substrate and includes a second opening. The first temporary opening and the second opening are generally aligned. A cover that is coupled to the substrate and encloses the MEMS die and the integrated circuit. The cover and the substrate form a back volume, and the diaphragm separates the back volume from a front volume. The first temporary opening is unrestricted at a first point in time to allow gasses present in the back volume to exit through the temporary opening to the exterior and the pierce-less diaphragm prevents the gasses from passing there through. The first temporary opening is later substantially filled and closed at a second point in time, after which the acoustic device becomes operational.

9 Claims, 5 Drawing Sheets

(51) Int. Cl.
*H04R 19/00* (2006.01)
*H04R 19/04* (2006.01)

(56) References Cited

U.S. PATENT DOCUMENTS

| | | | |
|---|---|---|---|
| 6,552,469 B1 | 4/2003 | Pederson | |
| 6,781,231 B2 | 8/2004 | Minervini | |
| 7,190,038 B2 | 3/2007 | Dehe | |
| 7,242,089 B2 | 7/2007 | Minervini | |
| 7,439,616 B2 | 10/2008 | Minervini | |
| 7,466,834 B2 * | 12/2008 | Ogura et al. | 381/174 |
| 7,473,572 B2 | 1/2009 | Dehe | |
| 7,501,703 B2 | 3/2009 | Minervini | |
| 7,633,156 B2 | 12/2009 | Minervini | |
| 7,781,249 B2 | 8/2010 | Laming | |
| 7,795,695 B2 | 9/2010 | Weigold | |
| 7,825,484 B2 | 11/2010 | Martin | |
| 7,829,961 B2 | 11/2010 | Hsiao | |
| 7,856,804 B2 | 12/2010 | Laming | |
| 7,903,831 B2 | 3/2011 | Song | |
| 8,018,049 B2 | 9/2011 | Minervini | |
| 8,169,041 B2 | 5/2012 | Pahl | |
| 8,358,004 B2 | 1/2013 | Minervini | |
| 8,450,817 B2 | 5/2013 | Minervini | |
| 8,526,665 B2 | 9/2013 | Lutz | |
| 8,624,384 B1 | 1/2014 | Minervini | |
| 8,624,385 B1 | 1/2014 | Minervini | |
| 8,624,386 B1 | 1/2014 | Minervini | |
| 8,624,387 B1 | 1/2014 | Minervini | |
| 8,629,551 B1 | 1/2014 | Minervini | |
| 8,629,552 B1 | 1/2014 | Minervini | |
| 8,704,360 B1 | 4/2014 | Minervini | |
| 8,781,140 B2 | 7/2014 | Lautenschlager | |
| 8,791,531 B2 | 7/2014 | Loeppert | |
| 8,842,859 B2 * | 9/2014 | Delaus et al. | 381/175 |
| 8,879,767 B2 | 11/2014 | Wickstrom | |
| 8,969,980 B2 | 3/2015 | Lee | |
| 8,995,694 B2 | 3/2015 | Vos | |
| 9,006,880 B1 | 4/2015 | Minervini | |
| 9,023,689 B1 | 5/2015 | Minervini | |
| 9,024,432 B1 | 5/2015 | Minervini | |
| 9,051,171 B1 | 6/2015 | Minervini | |
| 9,137,595 B2 | 9/2015 | Lee | |
| 9,139,421 B1 | 9/2015 | Minervini | |
| 9,139,422 B1 | 9/2015 | Minervini | |
| 9,148,731 B1 | 9/2015 | Minervini | |
| 2005/0207605 A1 | 9/2005 | Dehe | |
| 2007/0215962 A1 | 9/2007 | Minervini | |
| 2007/0278501 A1 | 12/2007 | Macpherson | |
| 2008/0175425 A1 | 7/2008 | Roberts | |
| 2008/0217709 A1 | 9/2008 | Minervini | |
| 2008/0267431 A1 | 10/2008 | Leidl | |
| 2008/0279407 A1 | 11/2008 | Pahl | |
| 2008/0283942 A1 | 11/2008 | Huang | |
| 2009/0001553 A1 | 1/2009 | Pahl | |
| 2009/0067659 A1 | 3/2009 | Wang et al. | |
| 2009/0092274 A1 | 4/2009 | Song | |
| 2009/0180655 A1 | 7/2009 | Tien | |
| 2010/0046780 A1 | 2/2010 | Song | |
| 2010/0052082 A1 | 3/2010 | Lee | |
| 2010/0128914 A1 | 5/2010 | Khenkin | |
| 2010/0183181 A1 | 7/2010 | Wang | |
| 2010/0246877 A1 | 9/2010 | Wang | |
| 2010/0290644 A1 | 11/2010 | Wu | |
| 2010/0322443 A1 | 12/2010 | Wu | |
| 2010/0322451 A1 | 12/2010 | Wu | |
| 2011/0013787 A1 | 1/2011 | Chang | |
| 2011/0075875 A1 | 3/2011 | Wu | |
| 2012/0043629 A1 | 2/2012 | Minervini | |
| 2012/0250897 A1 | 10/2012 | Michael et al. | |
| 2013/0177192 A1 | 7/2013 | Abry | |
| 2014/0037115 A1 | 2/2014 | Vos | |
| 2014/0037120 A1 | 2/2014 | Lim | |
| 2014/0037124 A1 | 2/2014 | Lim | |
| 2014/0064546 A1 | 3/2014 | Szczech | |
| 2014/0291783 A1 | 10/2014 | Talag | |
| 2014/0291784 A1 | 10/2014 | Conklin | |
| 2015/0117681 A1 | 4/2015 | Watson | |
| 2015/0172825 A1 | 6/2015 | Lim | |
| 2015/0195659 A1 | 7/2015 | Szczech | |
| 2015/0251898 A1 | 9/2015 | Vos | |

* cited by examiner

MEMS MICROPHONE WITH OUT-GASSING OPENINGS AND METHOD OF MANUFACTURING THE SAME

CROSS REFERENCE TO RELATED APPLICATIONS

This patent claims benefit under 35 U.S.C. §119 (e) to U.S. Provisional Application No. 61/815,419 entitled "A MEMS Microphone with Out-gassing Openings and Method of Manufacturing the Same" filed Apr. 24, 2013, the content of which is incorporated herein by reference in its entirety.

TECHNICAL FIELD

This application relates to MicroElectroMechanical System (MEMS) device and, more specifically, to avoiding damage to the devices.

BACKGROUND OF THE INVENTION

MicroElectroMechanical (MEMS) microphones are known. Generally speaking, in these devices a MEMS device or die (including a diaphragm and back plate) is disposed on a substrate (e.g., a printed circuit board (PCB)). A lid (or other type of cover) is attached over the substrate to enclose the MEMS device and integrated circuit. A port is disposed either through the lid (to make a top port device) or through the substrate (to make a bottom port device). Sound enters the port, moves the diaphragm, electrical energy (representative of the sound energy) is created, and this energy can be further processed or used by other devices.

During the manufacturing process, gasses can build up within the assembly. Current bottom port microphones require a pierced diaphragm to relieve gases that build up within the interior of the microphone assembly. In pierced diaphragm approaches, a small opening is maintained in the diaphragm to release these built-up gasses. Without relieving these gases, the lid can bend or otherwise deform, internal components can become damaged, or both. Another problem that sometimes occurs because of the build-up of gasses within the assembly is that the acoustic seal that secures the lid to the substrate can become compromised. This creates leakage problems and adversely affects microphone performance.

While the previous pierced diaphragm approaches reduced damage to the assembly, acoustic noise was also introduced. The pierced diaphragm can also allow debris to enter the assembly and become trapped between the diaphragm and the back plate. These problems have created dissatisfaction with previous approaches.

BRIEF DESCRIPTION OF THE DRAWINGS

For a more complete understanding of the disclosure, reference should be made to the following detailed description and accompanying drawings wherein.

Figure 1:
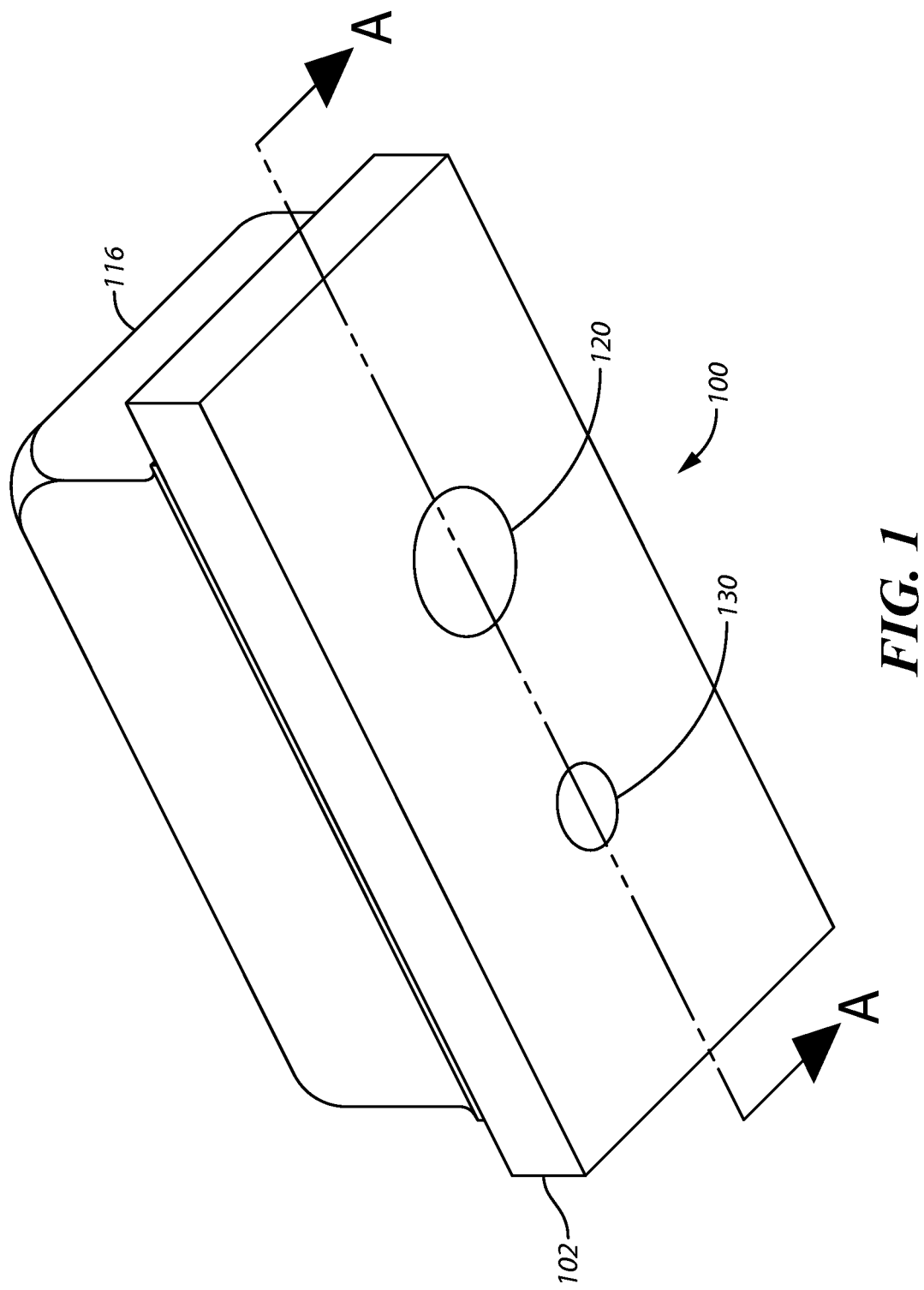
FIG. 1 comprises a perspective view of a microphone assembly with an opening extending through an integrated circuit according to various embodiments of the present invention.

Skilled artisans will appreciate that elements in the figures are illustrated for simplicity and clarity. It will further be appreciated that certain actions and/or steps may be described or depicted in a particular order of occurrence while those skilled in the art will understand that such specificity with respect to sequence is not actually required. It will also be understood that the terms and expressions used herein have the ordinary meaning as is accorded to such terms and expressions with respect to their corresponding respective areas of inquiry and study except where specific meanings have otherwise been set forth herein.

DETAILED DESCRIPTION

Approaches are provided that provide for out-gassing of a MEMS microphone assembly. This function is accomplished not through any opening in the diaphragm, but instead through other temporary holes or openings in the substrate. The present approaches provide for improved signal to noise ratios (SNRs) of MEMS microphones, improved survivability of MEMS microphones, and the reduction in the number of variations of MEMS microphone parts that are used to construct the assembly.

An acoustic apparatus includes a substrate, a micro electro mechanical system (MEMS) die, an integrated circuit, and a cover. The substrate includes a permanent opening extending there through. The MEMS die is disposed over the permanent opening, and the MEMS die includes a pierce-less diaphragm that is moved by sound energy. The integrated circuit is disposed on the substrate and is electrically coupled to the MEMS die.

A first temporary opening that extends through the substrate and a second opening extends through the integrated circuit. The first temporary opening is generally aligned with the second opening.

The cover is coupled to the substrate and encloses the MEMS die and the integrated circuit, such that the cover and the substrate form a back volume, and such that the diaphragm separates the back volume from a front volume.

The first temporary opening and the second opening are unrestricted at a first point in time to allow gasses present in the back volume to exit through the first temporary opening and the second opening to the exterior. The pierce-less diaphragm prevents the gasses from passing there through. The first temporary opening is later substantially filled and closed at a second point in time, after which the acoustic device becomes operational.

In some aspects, the first temporary opening is larger than the second opening. In other aspects, the second opening is at least partially filled after the second point in time. In other examples, the first temporary opening is closed with an epoxy.

A method of manufacturing an acoustic device is provided. The acoustic apparatus includes a substrate including a permanent opening, a micro electro mechanical system (MEMS) die that is disposed over the permanent opening. The MEMS die includes a pierce-less diaphragm that is moved by sound energy. The apparatus includes an integrated circuit disposed on the substrate and electrically coupled to the MEMS die.

The method creates a first temporary opening that extends through the substrate. A second opening extends through the integrated circuit and the first temporary opening is generally aligned with the second opening.

A cover is placed over the substrate to enclose the MEMS die and the integrated circuit, such that the cover and the substrate form a back volume, and such that the diaphragm separates the back volume from a front volume.

At a first point in time, unrestricted passage of gasses present in the back volume is allowed through the first temporary opening and the second opening to the exterior. The gasses do not pass through the diaphragm. Subsequently and at a second point in time, the first temporary opening is substantially filled and closed.

Figure 2:
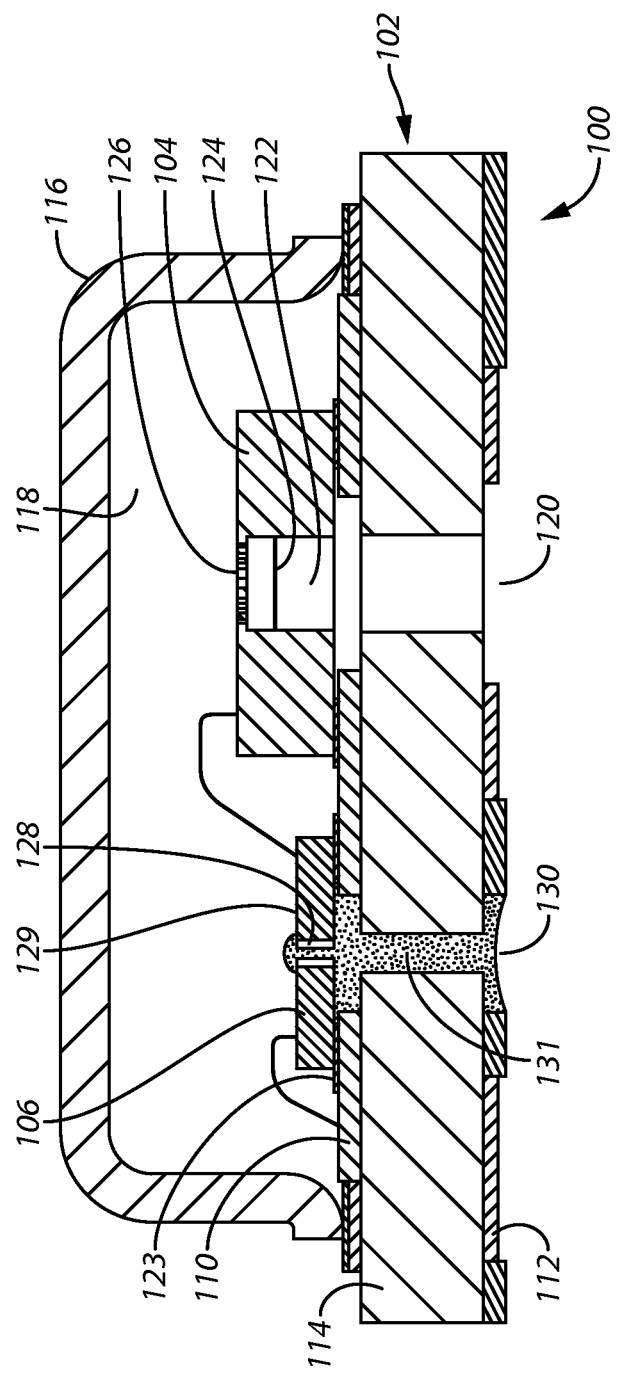
FIG. 2 comprises a cut-away side view of the microphone assembly of FIG. 1 along line A-A according to various embodiments of the present invention.

Referring now to FIG. 1 and FIG. 2, one example of a MEMS microphone assembly 100 is described. The microphone assembly 100 includes a substrate 102, a MEMS device 104, an integrated circuit 106, and wire bonds 108 coupling the MEMS device 104 to the integrated circuit 106. The substrate 102 includes a first conductive layer 110, a second conductive layer 112, and an insulative layer 114. The MEMS device 104 and the integrated circuit 106 are disposed on the first conductive layer 110.

A cover or lid 116 covers the MEMS device 104 and the integrated circuit 106 thereby creating a back volume 118. An acoustic port 120 is made through the substrate 102 forming a front volume 122. Die attachments 123 attach the MEMS device 104 and the integrated circuit 106 to the substrate 102.

The MEMS device 104 includes a diaphragm 124 and a back plate 126. Movement of the diaphragm 124 changes the distance with the back plate 126 creating an electrical signal.

The integrated circuit 106 includes an opening 128 therethrough that matches an opening 130 through the substrate 102. In one example, the opening 128 and opening 130 are approximately 40 um and 150 um in diameter.

The opening 128 and opening 130 provide an out-gassing path allowing gases from the back volume 118 to escape out to the exterior of the microphone assembly 100. After assembly, but in one example prior to singulation (dicing) of the assembly 100, the opening 128 and/or opening 130 in the integrated circuit 106 are filled with a low out-gassing filler material 131.

In some aspects, the integrated circuit 106 is specially built with the opening 128. A SAM coating can be applied to the integrated circuit to against aluminum (Al) bond corrosion This makes more back volume available, which improves electro-acoustic microphone performance, because it eliminates the need for an encapsulate material to be applied on the integrated circuit to protect the Al bond pad from corroding.

Once the out-gassing occurs, the openings 128 and 130 are plugged. In one example, the openings 128 and 130 are filled with the low out-gassing filler material 131, which in one example is an epoxy. After filling, the epoxy can then be cured. Once filled and cured, the back volume is essentially sealed from the exterior environment, except for an intentional barometric vent typically designed into the MEMs, allowing the microphone to operate.

In this way, a pierceless diaphragm is provided, but a vent is also temporarily provided for out-gassing purposes. Thus, damage to the assembly 100 is prevented from occurring, the signal-to-noised (SNR) ratio of the assembly 100 is improved, and the other benefits mentioned herein are also achieved.

Figure 3:
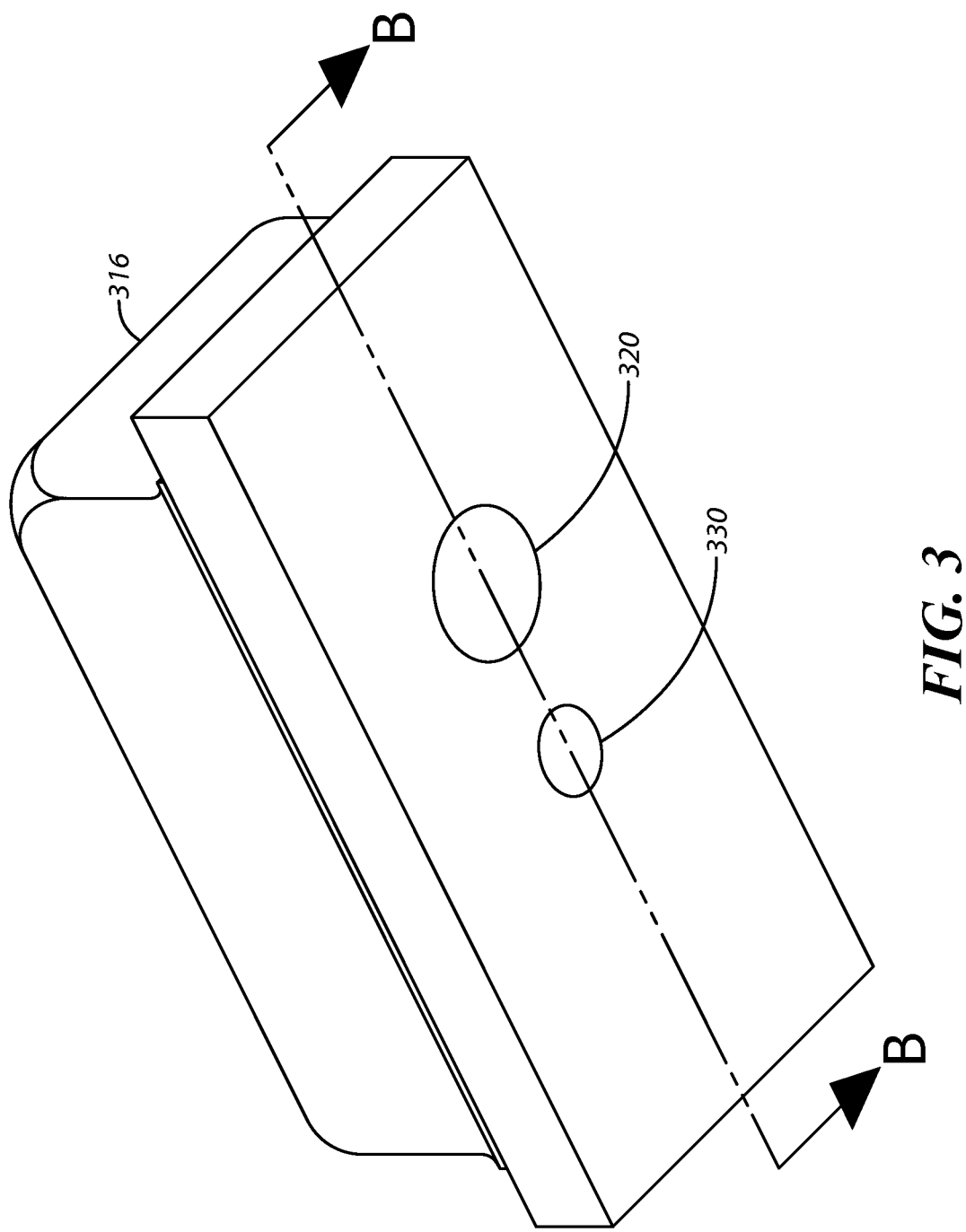
FIG. 3 comprises a perspective view of a microphone assembly with an opening that does not extend through an integrated circuit according to various embodiments of the present invention.
Figure 4:
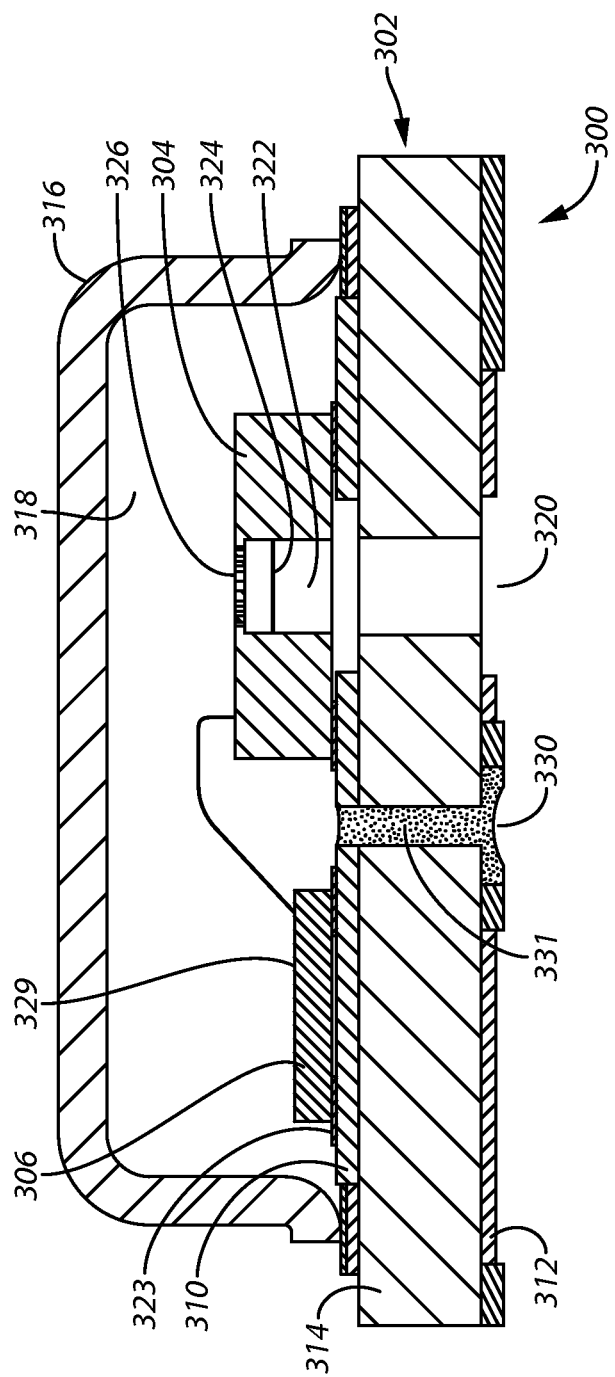
FIG. 4 comprises a cut-away side view of the microphone assembly of FIG. 3 taken along line B-B according to various embodiments of the present invention.

Referring now to FIG. 3 and FIG. 4 one example of a MEMS microphone assembly 300 is described. The microphone assembly 300 includes a substrate 302, a MEMS device 104, an integrated circuit 306, and wire bonds 308 coupling the MEMS device 304 to the integrated circuit 306. The substrate 302 includes a first conductive layer 310, a second conductive layer 312, and an insulative layer 314. The MEMS device 304 and the integrated circuit 306 are disposed on the first conductive layer 310.

A cover or lid 316 covers the MEMS device 304 and the integrated circuit 306 creating a back volume 318. An acoustic port 320 is made through the substrate 302 forming a front volume 322. Die attachments 323 attaches the MEMS device 304 and integrated circuit 306 to the substrate 302.

The MEMS device 304 includes a diaphragm 324 and a back plate 326. In contrast to the example of FIG. 1 and FIG. 2, the integrated circuit 306 does not include an opening. An opening 330 is provided through the substrate 302 but does not align with the integrated circuit 306.

The opening 330 provides an out-gassing path allowing gases from the back volume 318 to escape out to the exterior of the microphone assembly. After assembly, but in one example prior to singulation (dicing), the opening 330 is filled with a low out-gassing filler material 331, such as an epoxy. A SAM coating 329 can be applied to the integrated circuit 306.

In this way, a pierceless diaphragm is provided, but a vent is also temporarily provided for out-gassing purposes. Thus, damage to the assembly 300 is prevented, the SNR ratio of the assembly 300 is improved, and other benefits mentioned herein are achieved. In contrast to the example of FIG. 1 and FIG. 2, an opening is not needed and is not provided through the integrated circuit.

Figure 5:
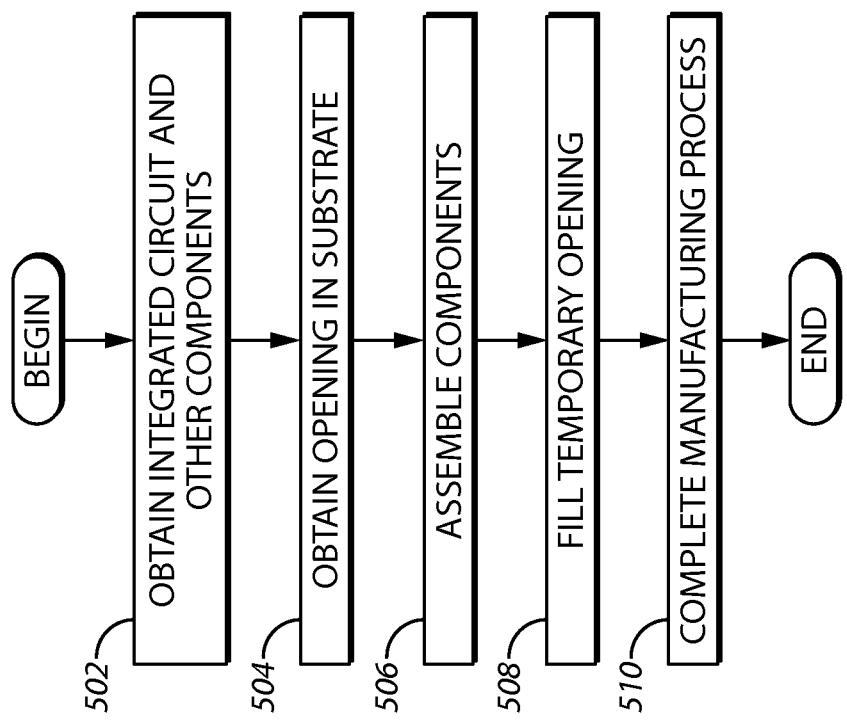
FIG. 5 comprises a flow chart of one approach for manufacturing a MEMS device and providing out-gassing according to various embodiments of the present invention.

Referring now to FIG. 5, one example of an approach for manufacturing a microphone with out-gassing openings is described. At step 502, an integrated circuit and other components of a microphone assembly (e.g., a MEMS device, a lid, an integrated circuit, and wire bonds) are obtained. The integrated circuit may, in some aspects, include an opening. At step 504, an opening is obtained in the substrate. In some examples, the opening may be formed as the substrate is constructed. In other examples, an opening may be drilled through the substrate.

At step 506, the components are assembled. For example, the MEMS device and the integrated circuit are secured to the substrate. In some examples and when an integrated circuit is used that has an opening, the opening in the integrated circuit is aligned with the opening in the substrate. When an integrated circuit is used that has no opening extending there through, then no alignment is needed with the opening in the substrate.

At step 508, and after some predetermined period of time (e.g., 30 minutes after completing step 506), the opening in the substrate is filled with a low out-gassing filler material such as an epoxy. Any conventional epoxy injection technique and apparatus may be used to accomplish this function. If an integrated circuit having an opening is used, the opening through the integrated circuit may also be filled. After filling, the epoxy is cured.

At step 510, the manufacturing process is completed. For example, the singulation process may be accomplished. By "singulation" and as used herein, it is meant individual separation of microphone circuits via a dicing saw process. The assembly can now be used.

Preferred embodiments of this invention are described herein, including the best mode known to the inventors for carrying out the invention. It should be understood that the illustrated embodiments are exemplary only, and should not be taken as limiting the scope of the invention.

What is claimed is:

1. An acoustic apparatus, the apparatus comprising:
   a substrate including a permanent opening extending there through;

a micro electro mechanical system (MEMS) die disposed over the permanent opening, the MEMS die including a pierce-less diaphragm that is moved by sound energy;

an integrated circuit being disposed on the substrate and being electrically coupled to the MEMS die;

a first temporary opening that extends through the substrate the first temporary opening not being an electrical conduit but being suited only for outgassing and a second opening extending through the integrated circuit, the first temporary opening being generally aligned with the second opening;

a cover that is coupled to the substrate and that encloses the MEMS die and the integrated circuit, such that the cover and the substrate form a back volume, and such that the diaphragm separates the back volume from a front volume;

such that the first temporary opening and the second opening are unrestricted at a first point in time after assembly to allow gasses present in the back volume to exit through the first temporary opening and the second opening to the exterior, the pierce-less diaphragm preventing the gasses from passing there through; and such the first temporary opening is later substantially filled and closed at a second point in time after assembly and after outgassing has occurred, after which the acoustic device becomes operational.

2. The acoustic apparatus of claim 1, wherein the first temporary opening is larger than the second opening.

3. The acoustic apparatus of claim 2, wherein the second opening is at least partially filled after the second point in time.

4. The acoustic apparatus of claim 1, wherein the first temporary opening is closed with an epoxy.

5. A method of manufacturing an acoustic device, the method comprising:

providing an acoustic apparatus, the apparatus comprising:

a substrate including a permanent opening, a micro electro mechanical system (MEMS) die disposed over the permanent opening, the MEMS die including a pierce-less diaphragm that is moved by sound energy;

an integrated circuit disposed on the substrate and being electrically coupled to the MEMS die;

creating a first temporary opening that extends through the substrate the first temporary opening not being an electrical conduit but being suited only for outgassing and wherein a second opening extends through the integrated circuit, the first temporary opening being generally aligned with the second opening;

placing a cover that over the substrate to enclose the MEMS die and the integrated circuit, such that the cover and the substrate form a back volume, and such that the diaphragm separates the back volume from a front volume;

at a first point in time after assembly, allowing unrestricted passage of gasses present in the back volume through the first temporary opening and the second opening to the exterior, the gasses not passing through the diaphragm; and subsequently and at a second point in time after assembly and after outgassing has occurred, substantially filling and closing the first temporary opening.

6. The method of claim 5 further comprising operating the acoustic device.

7. The method of claim 5, wherein the first temporary opening is larger than the second opening.

8. The method of claim 7, wherein the second opening is at least partially filled after the second point in time.

9. The method of claim 5, wherein the first temporary opening is closed with an epoxy.

* * * * *